(12) United States Patent
Li et al.

(10) Patent No.: US 11,339,478 B2
(45) Date of Patent: May 24, 2022

(54) SUSCEPTOR

(71) Applicants: KING ABDULLAH UNIVERSITY OF SCIENCE AND TECHNOLOGY, Thuwal (SA); KING FAHD UNIVERSITY OF PETROLEUM AND MINERALS, Dhahran (SA)

(72) Inventors: Xiaohang Li, Thuwal (SA); Kuang-Hui Li, Thuwal (SA); Hamad S. Alotaibi, Dhahran (SA)

(73) Assignees: KING ABDULLAH UNIVERSITY OF SCIENCE AND TECHNOLOGY, Thuwal (SA); KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 16/331,215

(22) PCT Filed: Sep. 18, 2017

(86) PCT No.: PCT/IB2017/055637
§ 371 (c)(1),
(2) Date: Mar. 7, 2019

(87) PCT Pub. No.: WO2018/051304
PCT Pub. Date: Mar. 22, 2018

(65) Prior Publication Data
US 2019/0186006 A1    Jun. 20, 2019

Related U.S. Application Data

(60) Provisional application No. 62/396,679, filed on Sep. 19, 2016.

(51) Int. Cl.
*C23C 16/458* (2006.01)
*C30B 25/12* (2006.01)
*C23C 16/46* (2006.01)

(52) U.S. Cl.
CPC ...... *C23C 16/4586* (2013.01); *C23C 16/4583* (2013.01); *C23C 16/4584* (2013.01);
(Continued)

(58) Field of Classification Search
CPC ............ C23C 16/4583; C23C 16/4584; C23C 16/4585; C23C 16/4586; C23C 16/46
See application file for complete search history.

(56) References Cited

U.S. PATENT DOCUMENTS 3,696,223 A * 10/1972 Metcalf ................... F27D 11/06
219/634
3,783,822 A * 1/1974 Wollam .................. C30B 25/08
118/725
(Continued)

FOREIGN PATENT DOCUMENTS

CA    2034765 A1    9/1991
CN    1489644 A     4/2004
(Continued)

OTHER PUBLICATIONS

Li, Kuang-Hui, et al., "Induction-heating MOCVD reactor with significantly improved heating efficiency and reduced harmful magnetic coupling". Journal of Crystal Growth, vol. 488, Apr. 15, 2018, pp. 16-22.*

(Continued)

*Primary Examiner* — Bret P Chen
(74) *Attorney, Agent, or Firm* — Patent Portfolio Builders PLLC

(57) ABSTRACT

A susceptor device for a chemical vapor deposition (CVD) reactor including metal organic CVD (MOCVD) used in the semiconductor industry. The susceptor device particularly is used with induction heating and includes a horizontal plate adapted for holding one or more wafers and a vertical rod around which the induction heating coils are disposed. A (Continued)

A. Mushroom type Susceptor with multiple rods

B. Mushroom type Susceptor with one rod screw system and an insulator can further be used. This design helps prevent undesired levitation and allows for the gas injectors of the reactors to be placed closer to the wafer for deposition during high-temperature deposition processes at susceptor surface temperatures of about 1500° C. or higher.

17 Claims, 15 Drawing Sheets

(52) U.S. Cl.
CPC .......... *C23C 16/4585* (2013.01); *C23C 16/46* (2013.01); *C30B 25/12* (2013.01)

(56) References Cited

U.S. PATENT DOCUMENTS

| | | | |
|---|---|---|---|
| 4,305,777 A * | 12/1981 | Kobayashi | C30B 11/00 117/34 |
| 4,579,080 A * | 4/1986 | Martin | C23C 16/4411 118/500 |
| 4,632,058 A * | 12/1986 | Dixon | C23C 16/44 118/725 |
| 5,242,501 A | 9/1993 | McDiarmid | |
| 5,370,739 A * | 12/1994 | Foster | C23C 16/45508 118/727 |
| 5,456,757 A * | 10/1995 | Aruga | C23C 16/4581 118/728 |
| 5,494,494 A * | 2/1996 | Mizuno | C23C 16/45519 414/935 |
| 5,700,725 A | 12/1997 | Hower et al. | |
| 5,709,543 A | 1/1998 | Shimazu | |
| 5,759,263 A | 6/1998 | Nordell et al. | |
| 5,788,777 A | 8/1998 | Burk, Jr. | |
| 5,835,678 A | 11/1998 | Li et al. | |
| 5,935,337 A * | 8/1999 | Takeuchi | C23C 16/45565 118/724 |
| 5,964,943 A | 10/1999 | Stein et al. | |
| 6,031,211 A * | 2/2000 | Mailho | C23C 16/46 219/121.4 |
| 6,062,851 A * | 5/2000 | Rudolph | C23C 16/045 432/250 |
| 6,121,592 A * | 9/2000 | Fishman | H05B 6/06 219/656 |
| 6,217,662 B1 | 4/2001 | Kong et al. | |
| 6,257,881 B1 * | 7/2001 | Fiala | C23C 16/4412 432/237 |
| 6,321,680 B2 | 11/2001 | Cook et al. | |
| 6,368,404 B1 * | 4/2002 | Gurary | C23C 16/46 117/103 |
| 6,425,504 B1 * | 7/2002 | Besser | B22D 41/08 266/280 |
| 6,436,796 B1 * | 8/2002 | Mailho | C23C 16/46 438/478 |
| 6,898,232 B2 * | 5/2005 | Miller | D01F 9/322 373/140 |
| 7,126,090 B2 | 10/2006 | Yamaguchi et al. | |
| 7,993,455 B2 | 8/2011 | Nakashima et al. | |
| 8,709,162 B2 | 4/2014 | Leung et al. | |
| 9,299,595 B2 | 3/2016 | Dunn et al. | |
| 2001/0045426 A1 * | 11/2001 | Eberhardt | C21D 1/42 219/635 |
| 2003/0029381 A1 * | 2/2003 | Nishibayashi | C23C 16/52 118/712 |
| 2003/0182924 A1 * | 10/2003 | Tsutsumi | F16G 13/16 59/78.1 |
| 2005/0274324 A1 * | 12/2005 | Takahashi | H01L 21/6831 118/723 E |
| 2006/0081614 A1 | 4/2006 | Nami et al. | |
| 2008/0036155 A1 | 2/2008 | Shimazaki et al. | |
| 2008/0149598 A1 * | 6/2008 | Hayashi | H01J 37/32522 216/67 |
| 2010/0059182 A1 | 3/2010 | Lee et al. | |
| 2010/0199914 A1 * | 8/2010 | Iza | C23C 16/45508 118/725 |
| 2011/0290175 A1 * | 12/2011 | Paranjpe | C23C 16/4582 118/712 |
| 2012/0148760 A1 * | 6/2012 | Egami | C30B 25/10 427/559 |
| 2012/0231615 A1 * | 9/2012 | Shiomi | C23C 16/4584 438/503 |
| 2013/0255578 A1 | 10/2013 | Sakong et al. | |
| 2014/0127887 A1 * | 5/2014 | Kraus | C23C 16/45534 438/478 |
| 2014/0231019 A1 * | 8/2014 | Kajihara | H01L 21/67103 156/345.51 |
| 2017/0327970 A1 * | 11/2017 | Muto | H01L 21/02529 |
| 2017/0370817 A1 * | 12/2017 | Ramos | G01N 1/42 |
| 2019/0118252 A1 * | 4/2019 | Bauer | B22F 10/10 |
| 2019/0335548 A1 * | 10/2019 | Li | C23C 16/46 |

FOREIGN PATENT DOCUMENTS

| | | | | |
|---|---|---|---|---|
| CN | 1771195 A | 5/2006 | | |
| CN | 101667525 A | 3/2010 | | |
| CN | 103361635 A | 10/2013 | | |
| CN | 101802254 B | 11/2013 | | |
| CN | 103436862 A | 12/2013 | | |
| CN | 106435524 A | 2/2017 | | |
| EP | 1329534 B1 * | 12/2008 | ............. | C23C 16/44 |
| EP | 1329534 B1 * | 12/2008 | ............. | C23C 16/44 |
| JP | H02186623 A | 7/1990 | | |
| JP | H03287770 A | 12/1991 | | |
| JP | 2003037071 A | 2/2003 | | |
| JP | 2003520746 A | 7/2003 | | |
| JP | 2006028625 A | 2/2006 | | |
| JP | 2013115264 A | 6/2013 | | |
| JP | 2016111043 A | 6/2016 | | |
| KR | 20130021755 A | 3/2013 | | |
| TW | 387092 B | 4/2000 | | |
| WO | 02063074 A1 | 8/2002 | | |
| WO | 2009049020 A2 | 4/2009 | | |
| WO | WO 2015199331 A1 * | 12/2015 | ........... | H01L 21/683 |
| WO | WO 2016/088671 A1 * | 6/2016 | ........... | H01L 21/205 |
| WO | 2017137872 A1 | 8/2017 | | |
| WO | WO 2017/186437 A1 * | 11/2017 | ................ | B01J 8/06 |

OTHER PUBLICATIONS

Zhiming, Li, et al., "A susceptor with a ∧-shaped slot in a vertical MOCVD reactor by induction heating". Journal of Semiconductors, vol. 35, No. 9, Sep. 2014, 092003, pp. 1-5.*
Li, Zhi-Ming, et al., "Optimization and Finite Element Analysis of the Temperature Field in a Nitride MOCVD Reactor by Induction Heating". Chinese Phys. Lett., vol. 27, No. 7, (2010) 070701, pp. 1-4.*
Danielsson, Orjan, "Simulations of Silicon Carbide Chemical Vapor Deposition". Linkoping Studies in Science and Technology, Dissertation No. 773, Department of Physics and Measurement Technology Linköpings universitet, SE-581 83 Linköping, Sweden, 2002, pp. 1-65.*
Li, Zhiming, et al., "A susceptor with partial-torus groove in vertical MOCVD reactor by induction heating". International Journal of Heat and Mass Transfer 75 (2014) 410-413.*
Li, Kuang-Hui, et al., "Induction-heating MOCVD reactor with significantly improved heating efficiency and reduced harmful magnetic coupling". Journal of Crystal Growth 488 (2018) 16-22.*
Li, Kuang-Hui et al., "Improvement of temperature uniformity of induction-heated T-shape susceptor for high-temperature MOVPE". 2019, pp. 1-18. Citation unavailable.*
Mei, Shuzhe, et al., "Theoretical analysis of induction heating in high-temperature epitaxial growth system". AIP Advances 8, 085114 (2018) pp. 1-9.*
Ellison, A., et al., "High temperature CVD growth of SiC". Materials Science & Engineering B, B61-B62 (1999) 113-120.*
Gourvest, E., et al., "Plasma Enhanced Chemical Vapor Deposition of Conformal GeTe Layer for Phase Change Memory Applications,"

(56) References Cited

OTHER PUBLICATIONS

ECS Journal of Solid State Science and Technology, Oct. 1, 2012, vol. 1, No. 6, pp. Q119-Q122.
International Search Report in corresponding/related International Application No. PCT/IB2017/055637, dated Nov. 16, 2017.
Written Opinion of the International Searching Authority in corresponding/related International Application No. PCT/IB2017/055637, dated Nov. 16, 2017.
First Office Action in corresponding/related Chinese Application No. 201780056663.7, dated Sep. 24, 2020 (Documents JP 2-186623A, U.S. Pat. No. 5,788,777A and JP2003037071A were cited in the IDS filed Mar. 7, 2019).
Second Office Action in corresponding/related Chinese Application No. 201780056663.7, dated Apr. 13, 2021.
Japanese Office Action for corresponding/related Japanese Patent Application No. 2019-536352, dated Aug. 30, 2021.
Notification on Grant of Patent Right for Invention in corresponding/related Chinese Application No. 201780056663.7, dated Oct. 11, 2021.
Communication pursuant to Article 94(3) EPC in corresponding/related European Application No. 17784011.3, dated Jan. 31, 2022.

\* cited by examiner

FIG. 10
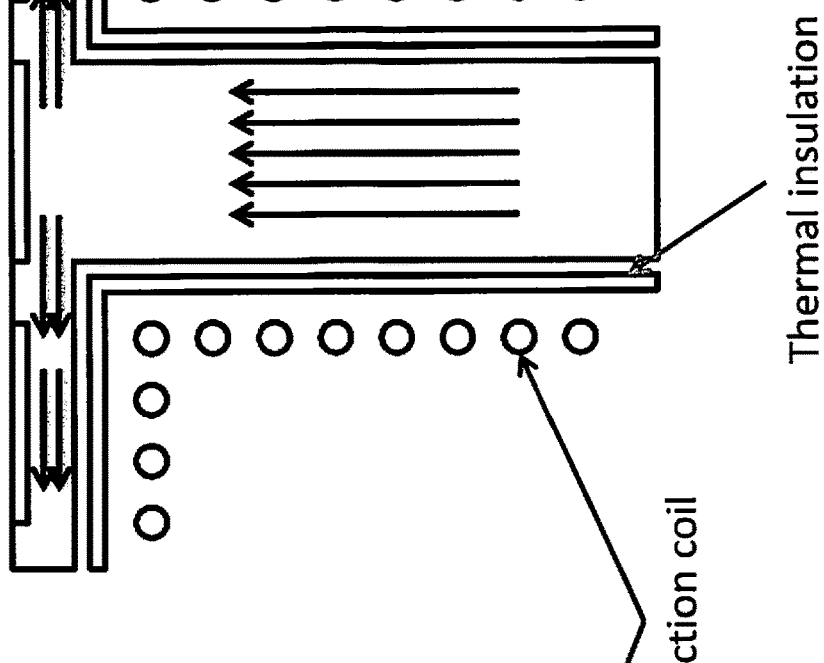
10B. With insulation, the heat is confined and conducted vertically
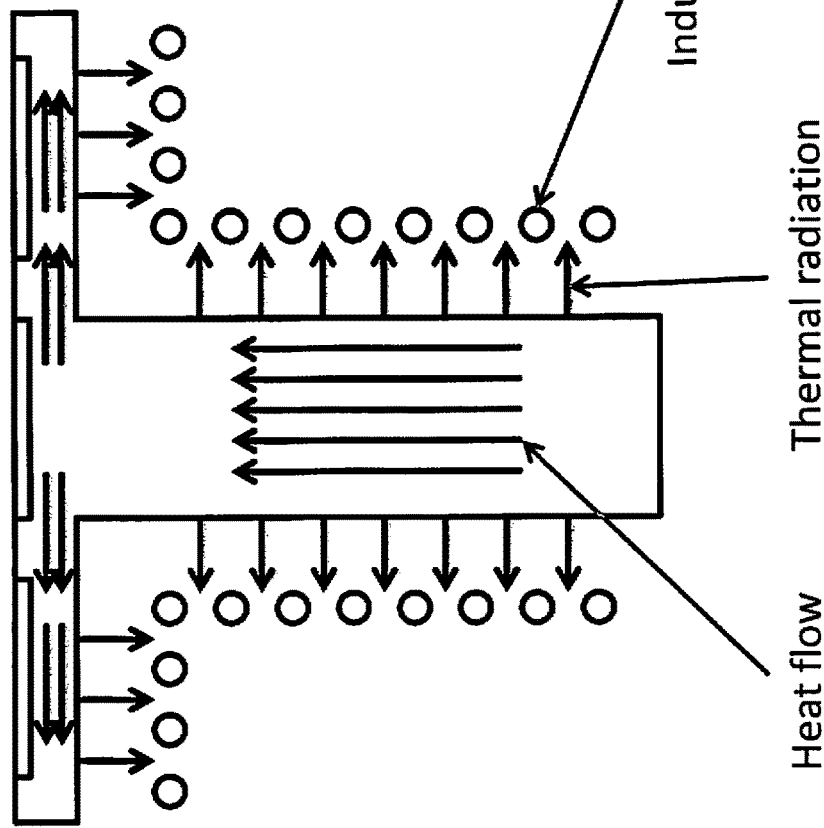
10A. Without insulation, the heat is lost and radiated back to the coils
Thermal insulation
Induction coil
Thermal radiation
Heat flow

FIG. 12
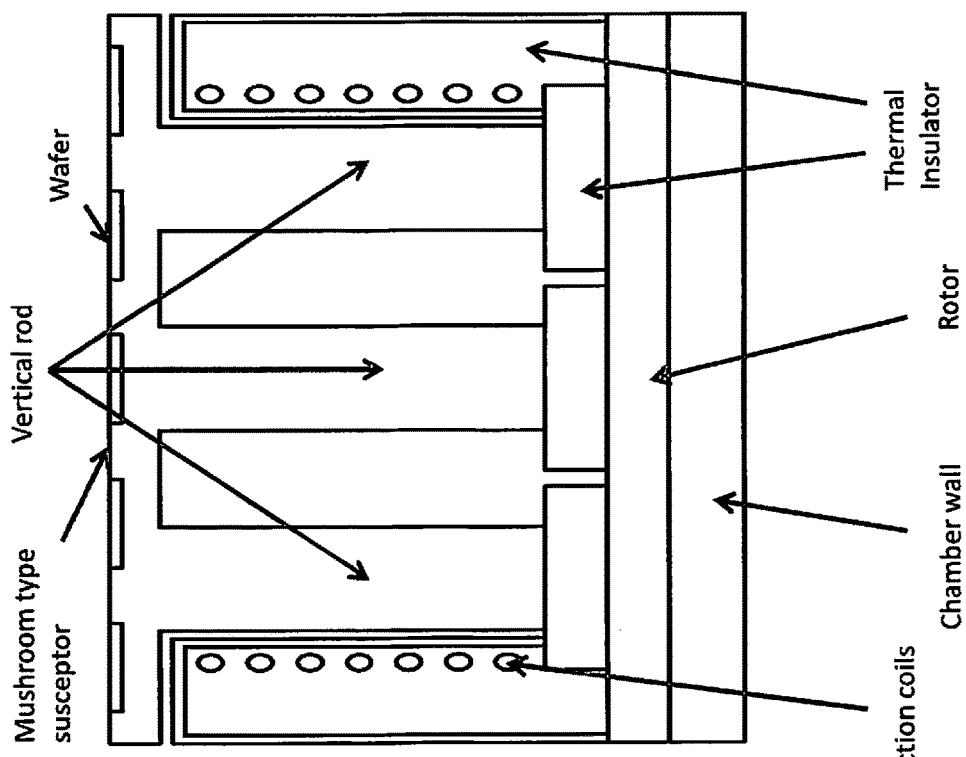
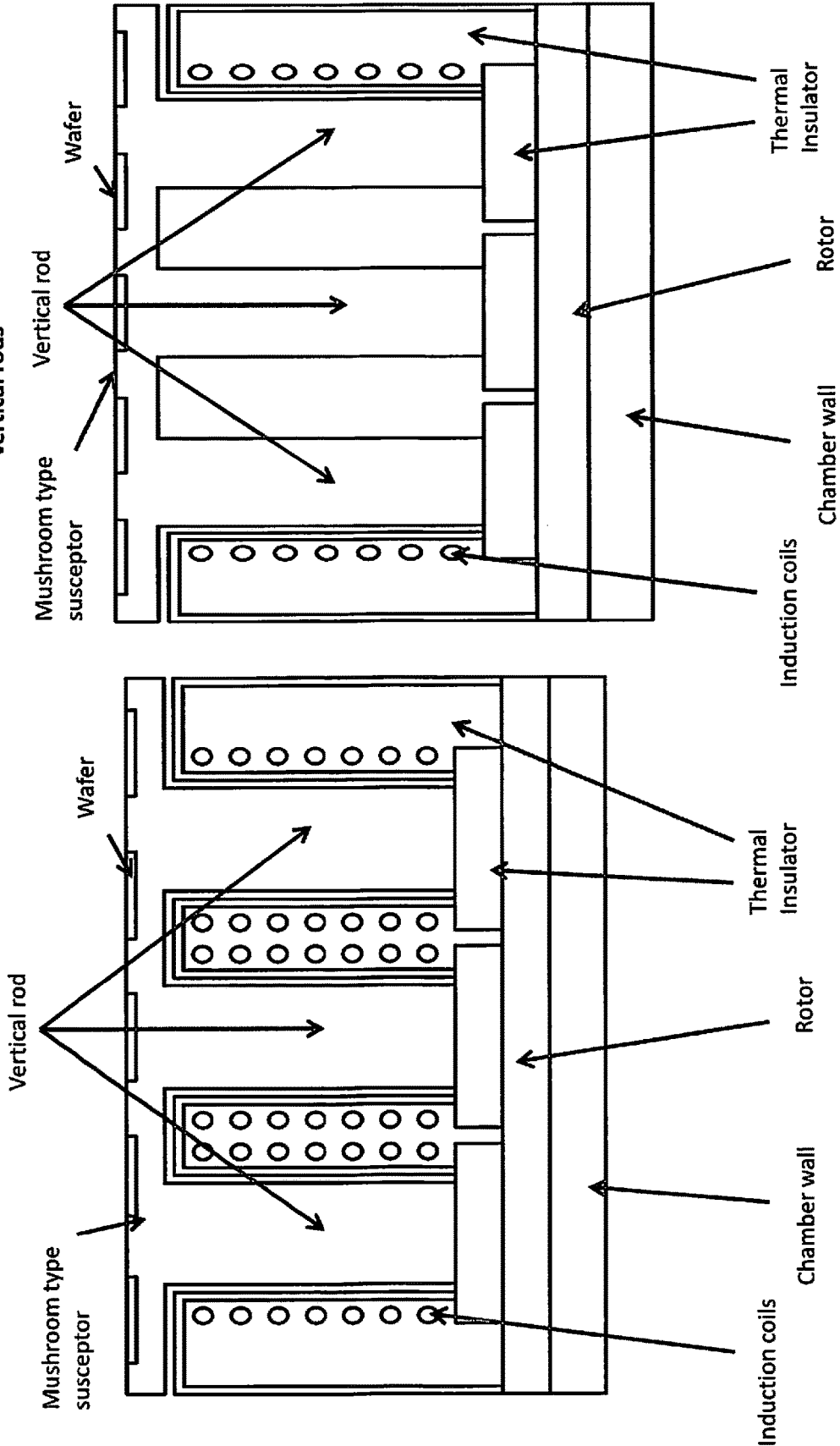

SUSCEPTOR

CROSS-REFERENCE TO RELATED APPLICATIONS

This application is a U.S. National Stage Application of International Application No. PCT/IB2017/055637, filed on Sep. 18, 2017, which claims priority and benefit to U.S. Provisional Application 62/396,679, filed Sep. 19, 2016, the entire contents of which are incorporated herein by reference.

BACKGROUND

There are various reactor designs for metal-organic chemical vapor deposition (MOCVD) reactors. In an MOCVD reaction, a film of material is formed on a heated wafer surface by reaction of reacting gases directed at the heated surface. The product can deposit on the surface of the wafer, and the gaseous by-products will be removed from the reactor by the exhaust pump. MOCVD reactors have been used for the preparation of a wide variety of epitaxial compounds, including various combinations of semiconductor single films and heterostructures such as lasers and LEDs.

In general, there are multiple options to heat up the wafer, but two options are most popular. The first option is heating by a resistive heater, and the second is heating by an induction heater. However, a conventional resistive heater typically cannot provide deposition temperature stability above about 1,500° C. for prolonged periods of the time due to dimension instability, i.e. warpage. Deposition temperature is the wafer surface temperature at which material deposits on the wafer surface. For this reason, an induction heater typically is used when a high temperature has to be provided above about 1,500° C. However, when increasing the deposition temperature to around 1700° C., prior art designs will encounter problems.

There is a recognized levitation issue for a conventional induction heating setup. See, for example, U.S. Pat. No. 6,368,404 describing how a susceptor can be levitated away from the underlying susceptor. This undesired levitation arises because an induction coil will generate an alternating magnetic flux, and this alternating magnetic flux will induce Eddy currents on the susceptor according to Faraday's Law. Eddy currents, induced by the induction coil on the surface of the susceptor, will interact with the magnetic flux, generated by the induction coil. When Eddy currents flow through the susceptor, Eddy currents will induce a magnetic flux, which is against the magnetic flux produced by the induction coil. The result is that the interaction between Eddy currents and magnetic flux creates a force which can cause levitation of the susceptor. This levitation force can cause the carrier to part from the induction heating device and lower heat transfer efficiency.

Further, any conductive object will induce Eddy currents when alternating magnetic flux, generated by the induction coil, approaches and pass through the object (see, for example, FIG. 4). The susceptor is typically placed in the center of an induction coil, so the alternating magnetic flux can easily penetrate any conductive object above the induction coil. Hence, other conductive objects need to be kept far away from the induction coil; otherwise, the objects will be heated up by the induction coil possibly causing damage. For MOCVD process, many gaseous reactants are injected into the reactor by gas inlets, commonly made of a conductor, and the chemical reaction will happen when these reactants meet each other on the surface of the wafer. At such high temperature (e.g., 1700° C.), the gas inlets need to be kept far away from the susceptor to avoid the magnetic flux. Otherwise, if the gas inlets are kept too close to the wafer surface, their temperature will increase due to the magnetic flux (the field will be even stronger when the power of induction heater increases), which will cause the reactants to decompose before reaching the wafer or they may deposit on the gas inlets surface. The reactants also may react before they reach the wafer surface, or some gas recirculation may occur. Also, there is a possibility of melting the gas inlets apparatus. However, if gas inlets are kept far away from the susceptor, this can cause low growth efficiency, non-uniform thin-film growth on the wafer, or low yield. To avoid this, the susceptor may need to be rotated at high revolutions per minute (RPM), but the rotation might cause recirculation flow of gases. This recirculation flow will affect the growth efficiency and quality.

Hence, better designs are needed for high-temperature MOCVD's with the use of induction heating in a CVD apparatus.

SUMMARY

Embodiments described and/or claimed herein include, for example, structures, devices, apparatuses, and systems, and methods of making and methods of using such structures, devices, apparatuses, and systems.

A first aspect is a susceptor device for a chemical vapor deposition (CVD) reactor comprising: at least one horizontal plate which is adapted for holding at least one wafer; at least one vertical rod integrated with and perpendicular to the horizontal plate, wherein the susceptor device is adapted for induction heating.

In one embodiment, the susceptor device is free of a resistive heater.

In one embodiment, the susceptor device comprises two or more vertical rods integrated with and perpendicular to the horizontal plate.

In one embodiment, the vertical rod functions as a heat source for the horizontal plate.

In one embodiment, the susceptor is adapted so it can be rotated during the CVD process.

Another embodiment is a CVD apparatus comprising the susceptor device as described and/or claimed herein.

In one embodiment, the apparatus further comprises a thermal insulation structure which at least partially surrounds the susceptor.

In one embodiment, the apparatus further comprises a showerhead injection structure.

In on embodiment, the apparatus comprises at least one induction coil and at least one reaction chamber, and the induction coil is installed inside the reaction chamber.

Another embodiment provides for a method of using the CVD apparatus as described and/or claimed herein, wherein the CVD is carried out at a susceptor surface temperature of at least 1500° C.

In one embodiment, the susceptor surface temperature at which CVD is carried out is at least 1,600° C., or is at least 1,700° C.

At least some advantages in at least some embodiments include avoiding the levitation problem; harvesting more power transferred from the induction heater which results in higher energy efficiency; higher growth rates; and/or better film homogeneity and quality.

Other possible advantages for at least some embodiments include, for example, the gas inlets can be placed near to the surface of the wafers (e.g. less than 10 mm) which will reduce the needs of high flow rates of the precursors; and minimize the need for some inert gases like $H_2$ or $N_2$ to suppress the recirculation and increase the growth uniformity. Also, the power efficiency will be higher because the vertical rod will be occupying most of the magnetic flux zone of the coil which means maximum power will be utilized to heat up the susceptor as shown, for example, in FIG. 6.

BRIEF DESCRIPTION OF THE DRAWINGS

FIG. 10 illustrates in one embodiment the vertical rod part of the mushroom-like susceptor without surrounding insulation (10A, left) and with surrounding insulation (10B, right), and it shows the importance of the insulator in protecting the coil and confining the heat.

FIG. 12 illustrates in two embodiments the mushroom susceptor with multiple coils surrounding each vertical rod (12A, left), or one coil surrounding all the vertical rods (12B, right).

DETAILED DESCRIPTION

Introduction

Additional, more detailed description is provided hereinbelow.

References cited herein are incorporated herein by reference in their entirety.

Chemical vapor deposition (CVD), metal organic chemical vapor deposition (MOCVD), metal organic vapor phase epitaxy (MOVPE), and organometal vapor phase epitaxy (OMVPE) are methods known in the art, and carrying out such methods are also known in the art. See, for example, *Chemical Vapor Deposition: Principles and Applications*, Hitchman, Jensen (Eds.), 1993. See also, for example, U.S. Pat. Nos. 9,299,595; 8,709,162; 7,126,090; 6,321,680; 6,031,211; 5,964,943; 5,835,678; 5,759,263; 5,700,725; and US Patent Publication No. 2010/0199914; 2008/0036155 and other references cited herein. See also JP 2013115264 and CN 103436862. Methods for making reactors to carry out such methods are known in the art.

In one embodiment, the shim, the fluid manifold, or any other element described in U.S. Pat. No. 9,299,595 is not part of the device, apparatus, or methods of the presently claimed inventions.

The inventive embodiments relate to chemical vapor deposition (CVD) and, in particular, metal organic chemical vapor deposition (MOCVD). MOCVD is widely used, for example, for growing III-V semiconductor material which is a common material for fabricating laser and LEDs device. In preferred embodiments, the inventive embodiments solve levitation issues when an induction heating system is applied. Furthermore, gas inlets can be placed even closer to the wafer surface in the inventive embodiments when the induction heating system is applied. In essence, preferred embodiments provide for integrating a wafer holder and a heating component into a whole part with a mushroom-like shape. This mushroom-like structure can harvest more power transferred from induction heater, and results in higher energy efficiency.

Figure 1:
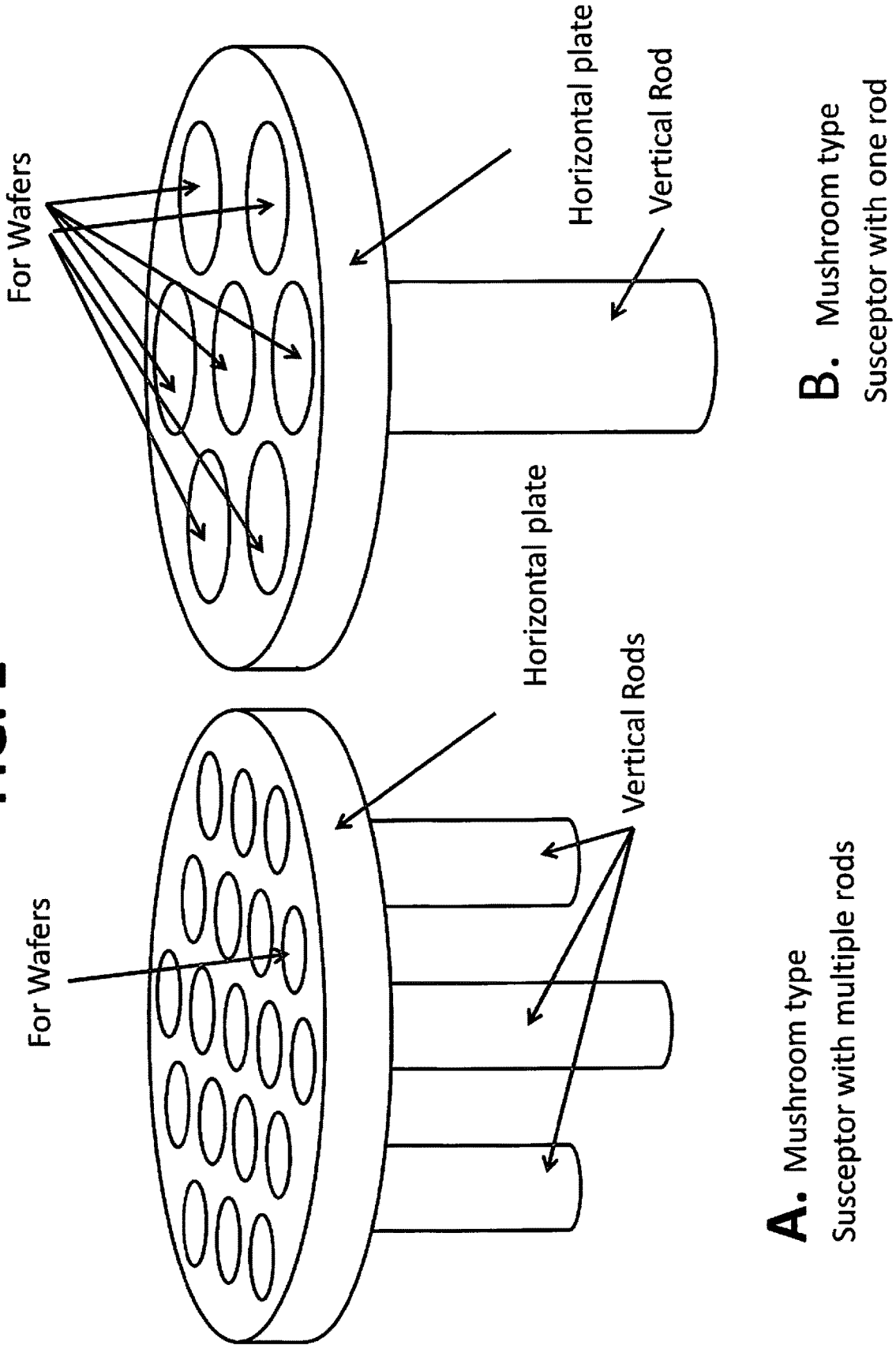
FIG. 1 illustrates one embodiment for a mushroom-like susceptor structure with multiple-wafer capability where multiple vertical rods are integrated with the horizontal plate (1A, left) and another embodiment with only a single vertical rod (1B, right).
Figure 14:
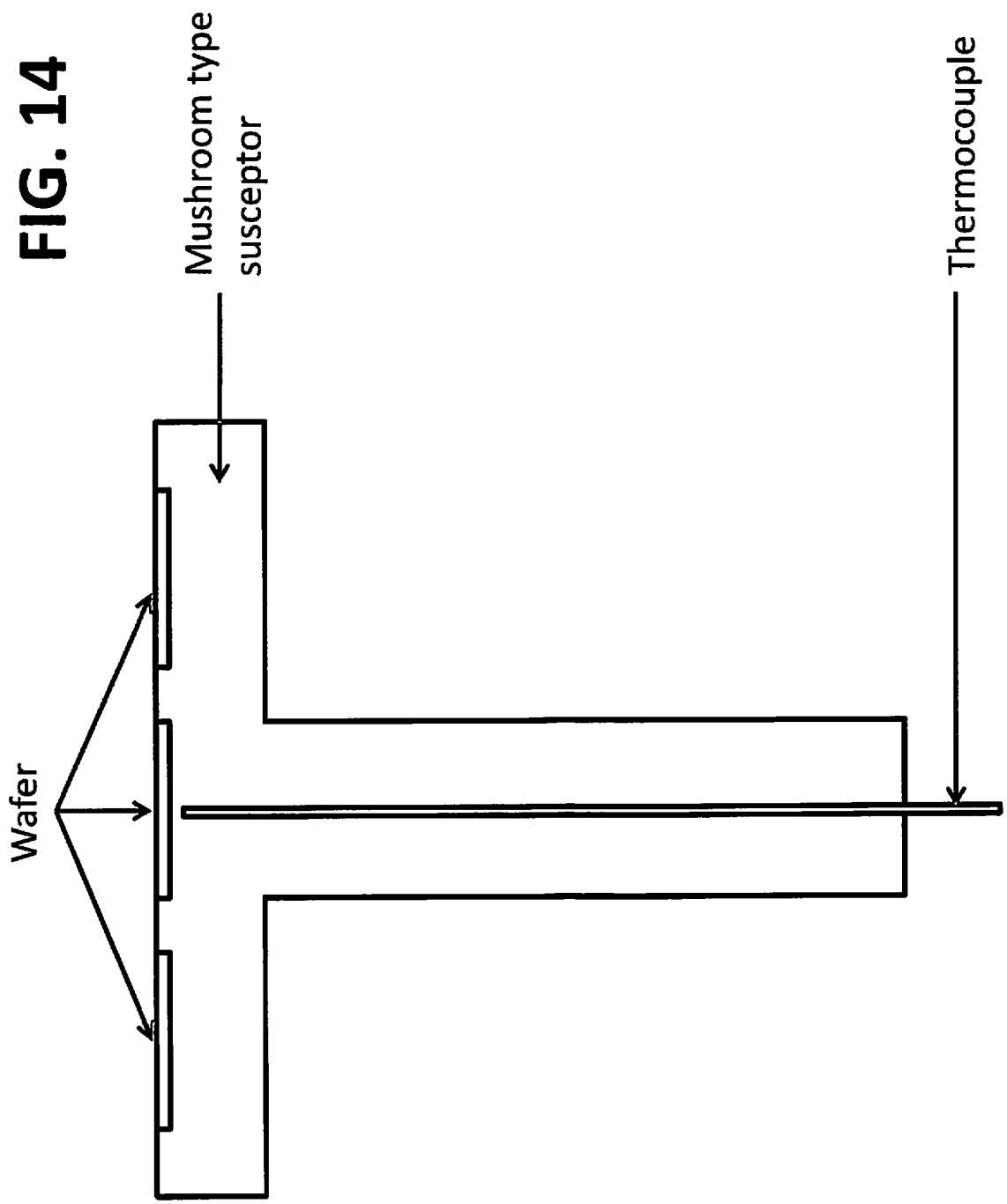
FIG. 14 illustrates in one embodiment the mushroom susceptor where there is a thermocouple hole inside the vertical rod for a thermocouple probe to measure the temperature of the horizontal plate.

In a preferred embodiment, a mushroom-like structure is an integrated component which contains a horizontal plate and a perpendicular rod, as shown in FIG. 1. One or more wafers can be directly placed on the plate. One or more induction coils can be placed beneath the plate and surround the vertical rod, respectively. Also, a thermal insulator can be used in one embodiment to protect the coils from melting as well as confining the heat and controlling heat flow. Furthermore, the mushroom-like susceptor can have a hole for a thermocouple, which can measure wafer temperature accurately, as shown in FIG. 14.

The susceptor device structure is made of one or materials which are an electric conductor. By this preferred design, the plate can block the alternating magnetic flux induced by the induction coil. Further, this mushroom-like structure is fixed by, for example, a system of screws, so that it can prevent levitation. See FIGS. 7-9.

Susceptor Device

Provided herein is a susceptor device for a chemical vapor deposition (CVD) reactor. The device comprises at least one horizontal plate which is adapted for holding at least one wafer; and at least one vertical rod integrated with and substantially perpendicular to the horizontal plate. The vertical rod can join the horizontal plate in the middle of the plate. One can call this susceptor device structure, based on a horizontal plate with a vertical rod, a "mushroom-shaped susceptor" for convenience.

A non-limiting example of the susceptor device is shown in FIGS. 1A and 1B, which shows the horizontal plate and one or more vertical rods. The horizontal plate can have one or more regions for accepting one or more wafers.

Figure 13:
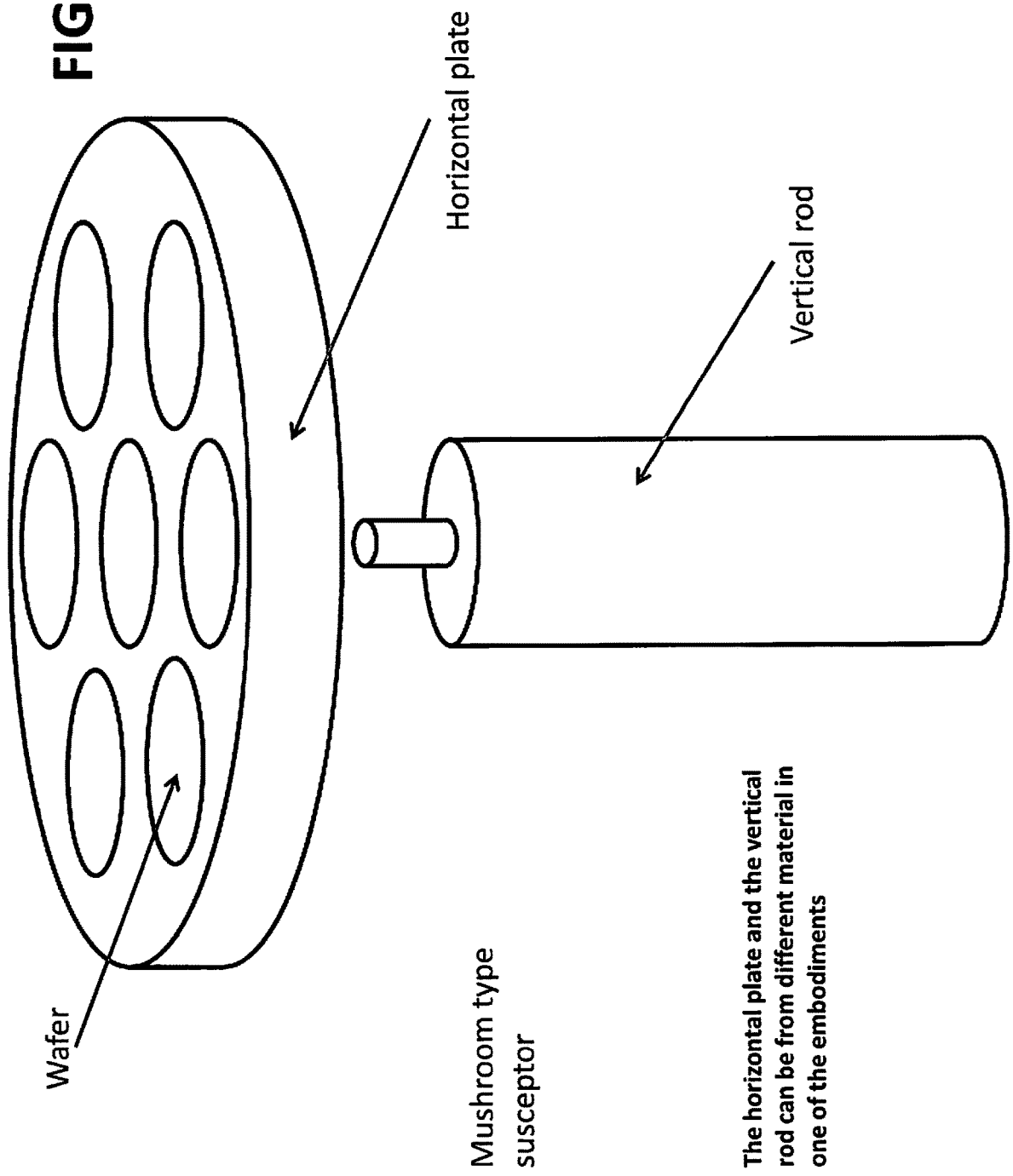
FIG. 13 illustrates in one embodiment the mushroom susceptor where the horizontal plate is not integrated to the vertical rod, and optionally, they may comprise different materials.

The susceptor device, both the horizontal plate and the vertical rod, can be made out of electronically or electrically conductive materials (not ionically conductive materials), as known in the art, including graphite or metals including molybdenum. The electronic conductivity must be sufficient to allow the Eddy current to be induced in the susceptor and for the temperature rise from induction heating, as known in the art. As shown in FIG. 13, the same or different materials can be used for the horizontal plate and vertical rod.

As known in the art, the horizontal plate can comprise one or more depressions or impressions designed to hold one or more wafers which are subjected to the deposition process as shown in FIGS. 1A and 1B. In more detail, this means each wafer has to be placed in a groove "depression" preventing the wafer from moving. See, for example, U.S. Pat. No. 5,242,501. In preferred embodiments, the number of wafers which can be disposed on the horizontal plate can be, for example, at least one, at least two, or at least five, or 2-100. A typical size of the wafer can be, for example, 2, 4, 6, 8, or 12 inches in diameter. Wafers are known in the art and can come in different sizes such as, for example, 2, 3, 4, 6, or 8 inch wafers.

Figure 11:
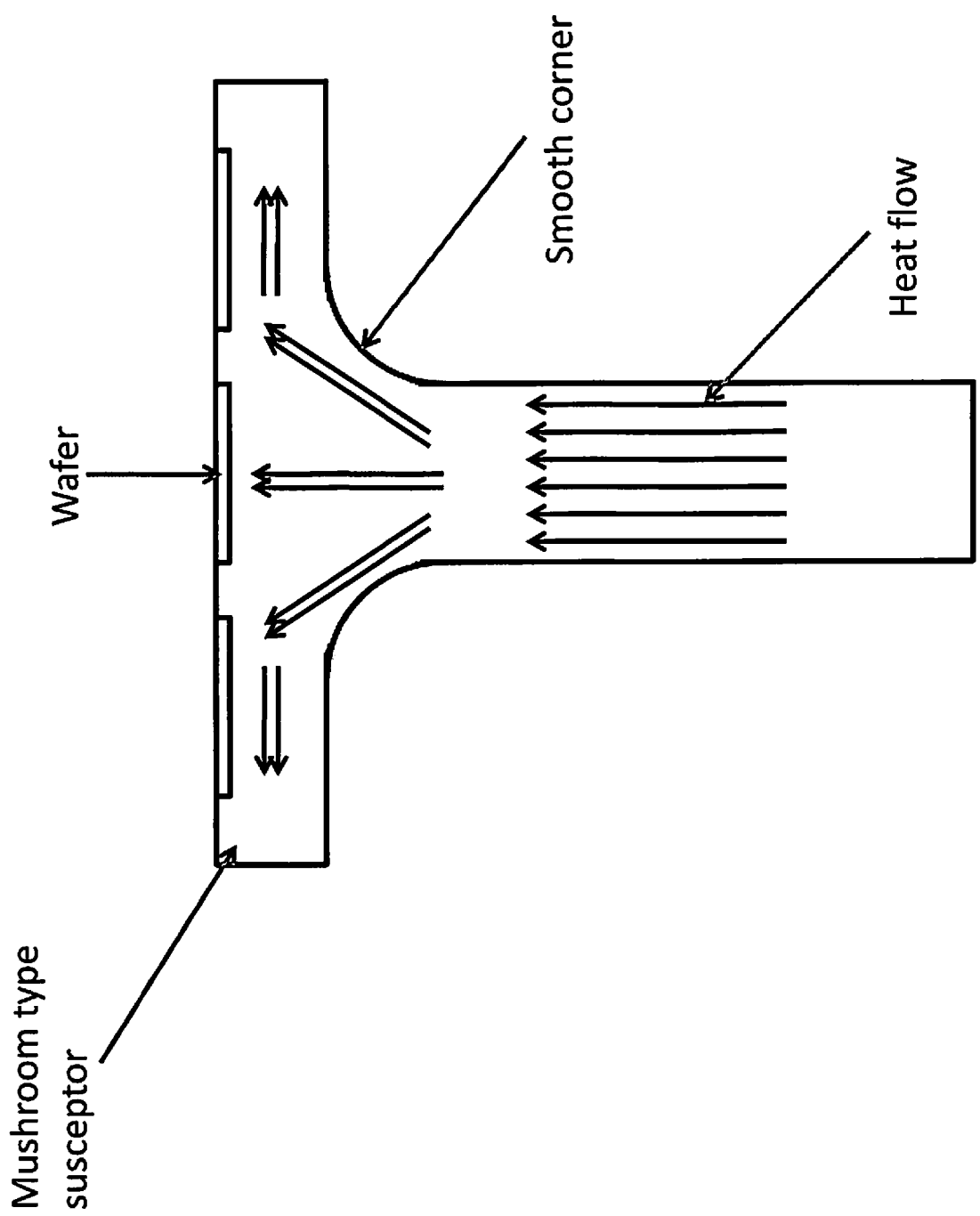
FIG. 11 illustrates in one embodiment the mushroom susceptor with curved or smooth corners to facilitate the heat conduction to the edge of the horizontal plate.

In a preferred embodiment, the horizontal plate is a cylindrical, symmetrical disk shape in which the diameter is larger than the height. There can be an optimal height of the horizontal plate to ensure temperature uniformity. In a preferred embodiment, the vertical rod can be a cylindrical, symmetrical shape in which the diameter is less than the height. FIG. 11 shows an embodiment in which smooth or rounded corners can be used.

Figure 5:
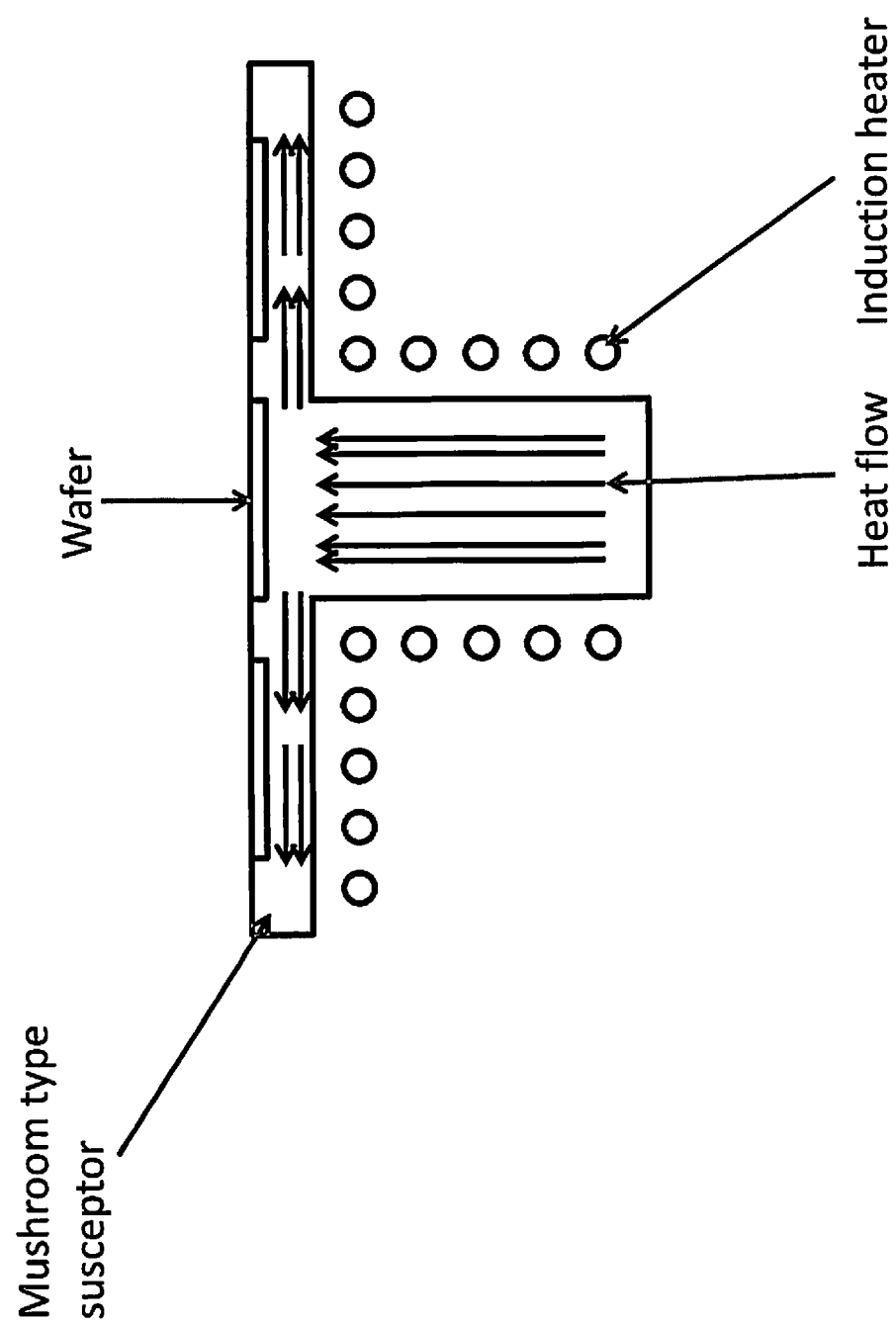
FIG. 5 illustrates in one embodiment the cross section of the mushroom type susceptor where heat conduction between the vertical rod and the horizontal plate is shown. A key point is that the vertical rod is heat source which conducts heat to horizontal plate.

The vertical rod can function as a heat source for the horizontal plate (see, for example, FIG. 5). The ratio of plate diameter and vertical rod height is related to the design and can be adapted for a particular application. The length of the vertical rod can be as long as the coil. The vertical rod can be surrounded by more turns of coils if the vertical rod is longer. The more turns of the coil there can be, the stronger can be the magnetic flux. The stronger magnetic flux can induce more Eddy current on the vertical rod which can heat up the rod further. In some embodiments, the diameter of the vertical rod is equal or larger than the wafer's diameter to heat it up uniformly.

The ratio of the diameter of the horizontal plate to the length of the vertical rod can be, for example, 1:0.8.

The ratio between the diameter of the horizontal plate to the diameter of the rod can be important. If the diameter of the plate is much larger than the diameter of the rod, the plate periphery will not heat up. The ratio can be, for example, about 1:0.6.

The size of a typical susceptor device can be described by the following: the diameter of the horizontal plate can be, for example, three inches. The thickness of the plate can be, for example, 0.25 inches. The diameter of the rod can be, for example, two inches.

Integrating the vertical rod to the horizontal plate can increase the power efficiency because the rod is occupying most of the magnetic flux zone which means maximum power will be utilized to heat the vertical rod. The vertical rod acts as a heat source which conducts the heat to the horizontal plate as shown in FIG. 5. In another embodiment, the mushroom susceptor can have curved corners to maximize the heat conduction to the horizontal plate as shown in FIG. 11. Also in one embodiment, the rod may be surrounded with an insulating material to confine the heat inside the vertical rod and conduct the maximum heat toward the horizontal plate. Furthermore, the insulating material can protect the coils from excessive heat as shown in FIG. 10.

Figure 7:
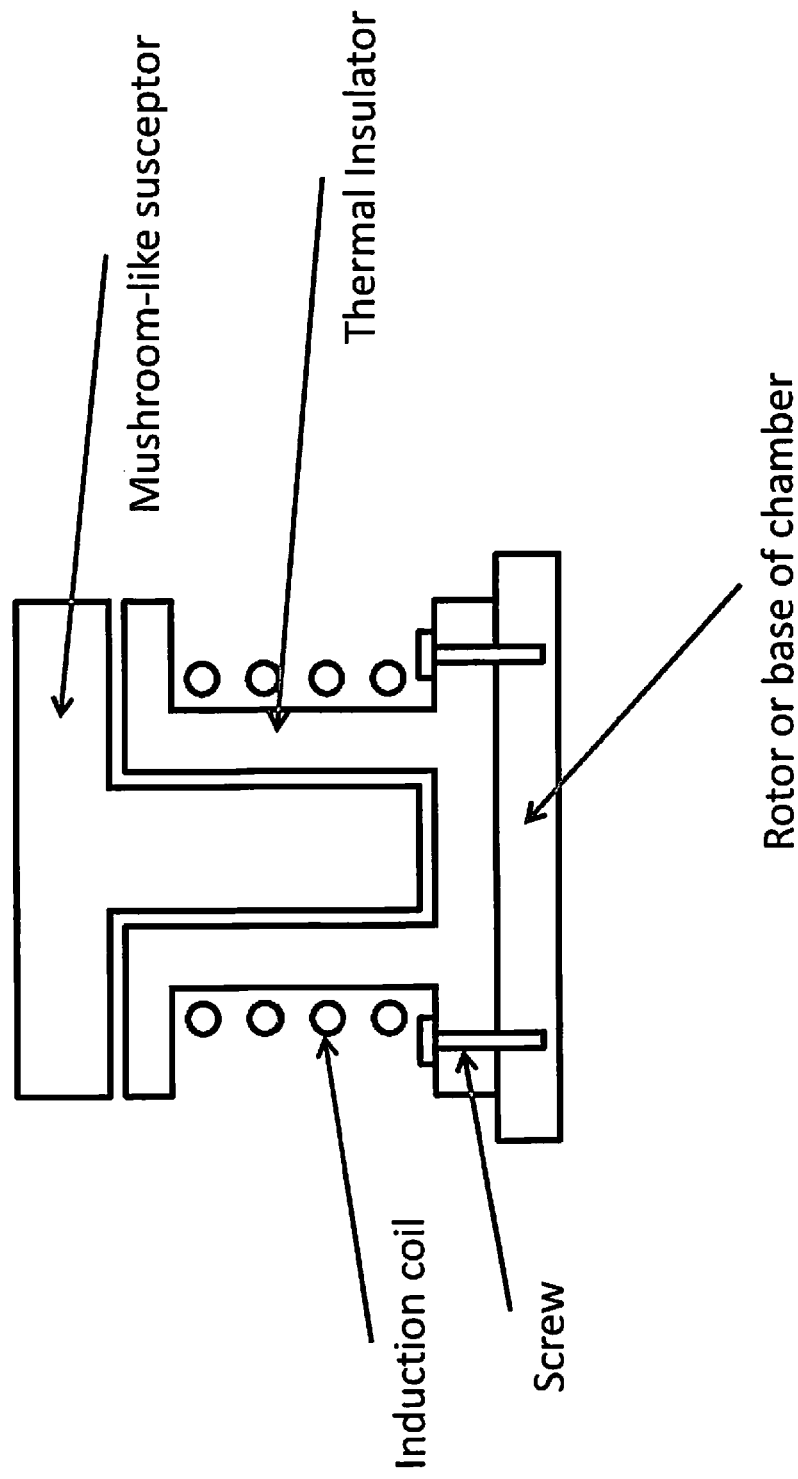
FIG. 7 illustrates in one embodiment mushroom-like susceptor surrounded by a thermal insulator that is fixed by a plurality of screws and mounted on either the base of the reactor or a rotator.
Figure 8:
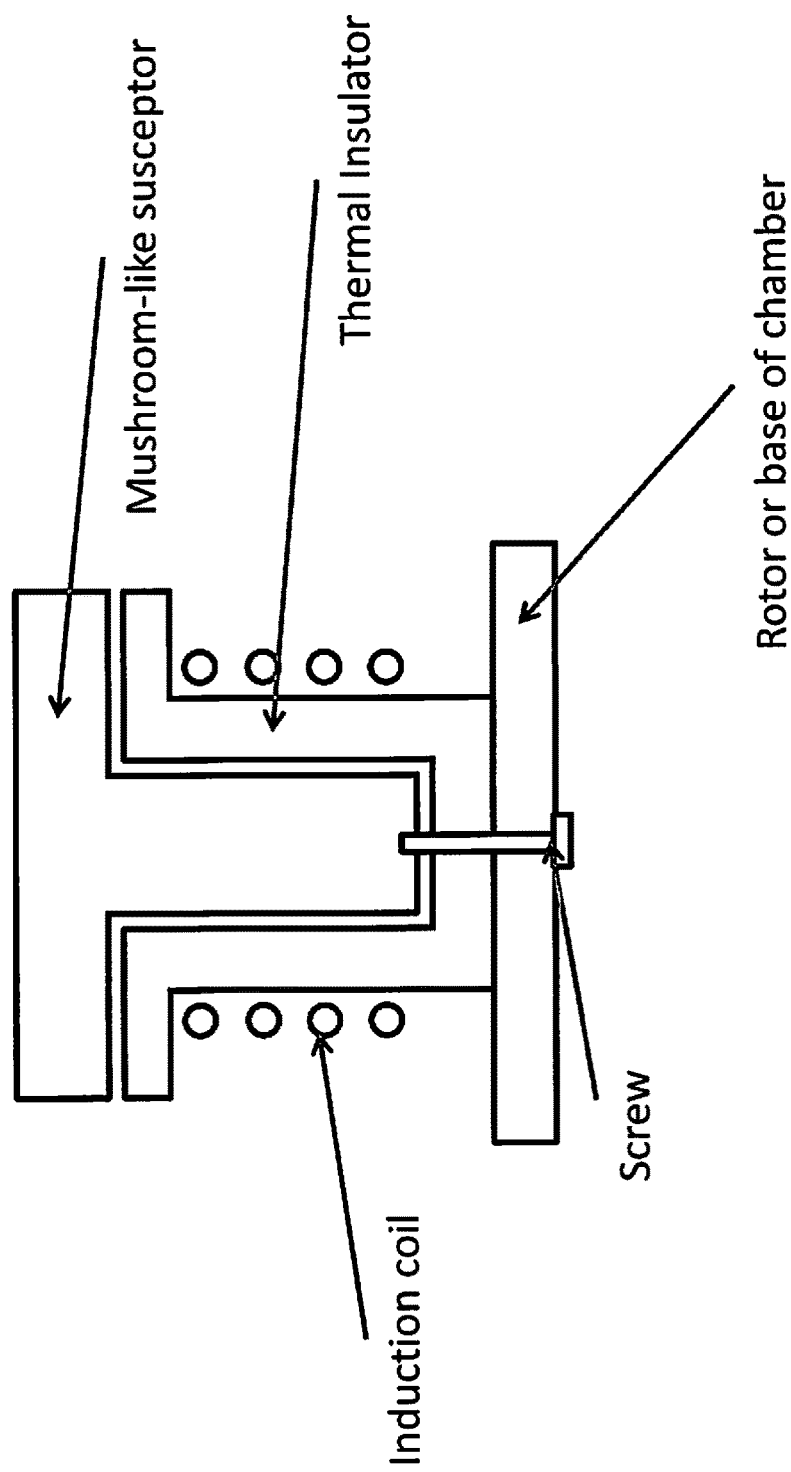
FIG. 8 illustrates in one embodiment a mushroom-like susceptor surrounded by a thermal insulator that is fixed by a screw which penetrates the base of the reactor and thermal insulator, to the bottom of the susceptor.
Figure 9:
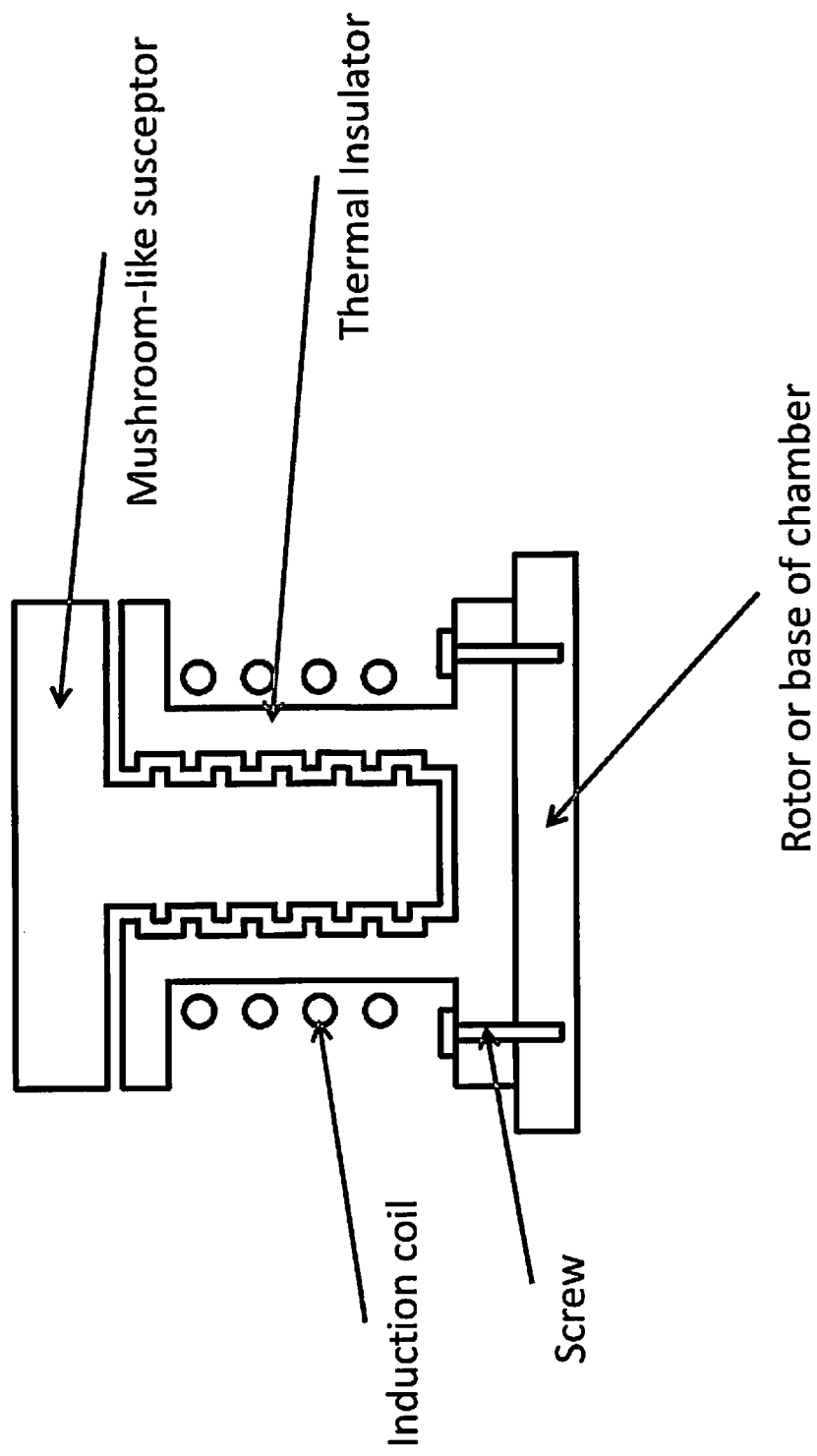
FIG. 9 illustrates in one embodiment the vertical rod part of the mushroom-like susceptor which can be made a bolt-like structure and the thermal insulator which can be made a screw hole. Mushroom-like susceptor itself is screw mounted into the thermal insulator.
Figure 15:
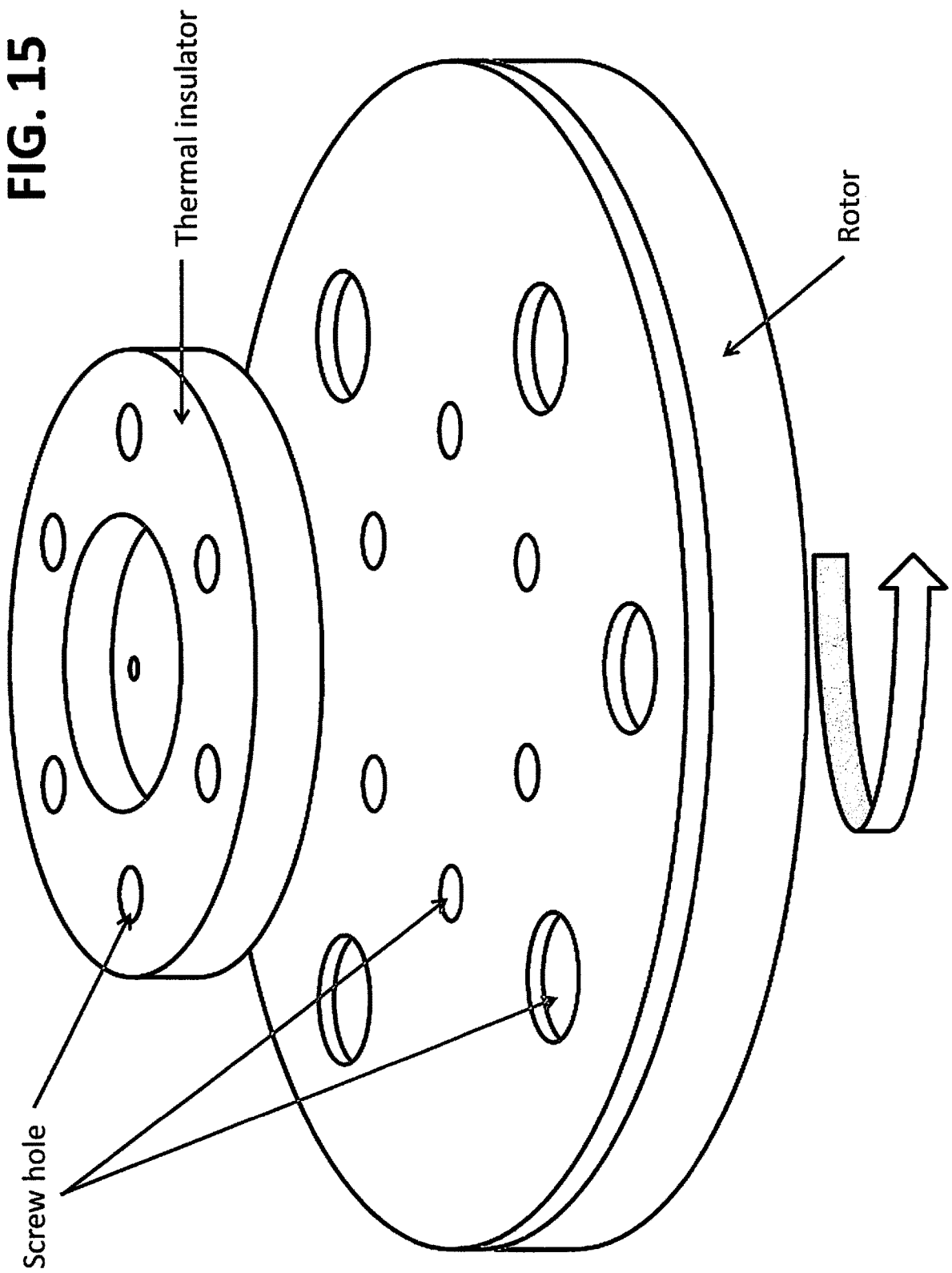
FIG. 15 illustrates the thermal insulator underneath the vertical rod and how it can be mounted on the rotor.

The present invention can help to solve the issues described herein. For the levitation problem, there are at least three embodiments which can further help to avoid this problem. In one embodiment, the mushroom-like susceptor is surrounded by a thermal insulator, as shown in FIG. 7. The susceptor can resist levitational force by its weight, and the thermal insulator can prevent the susceptor from swaying due to levitational force. The thermal insulator is fixed by a plurality of screws and is mounted on either the base of the reactor or a rotator if susceptor rotation is desired or required. In another embodiment, the mushroom-like susceptor is surrounded by a thermal insulator, as shown in FIG. 8, and fixed by a screw which penetrates the base of the reactor and thermal insulator to the bottom of the susceptor. Also, the volumetric mass density of the susceptor is high which may prevent its levitation. In another embodiment, the vertical rod part of the mushroom-like susceptor can be made into bolt-like structure with threads, and the thermal insulator can be machined with corresponding threads on the inner wall. The mushroom-like susceptor itself can be screw mounted into thermal insulator as shown in FIG. 9. Moreover, the coil may be mainly placed around the rod only, which will reduce the magnetic flux above the susceptor. The primary heating mechanism will be from the thermal conduction between the vertical rod and the horizontal plate. FIGS. 10A and 10B show further the importance of the use of thermal insulation. FIG. 15 shows more how the thermal insulator can be integrated with the base. The mushroom-like structure can be stabilized under induction heating process by these designs.

Figure 6:
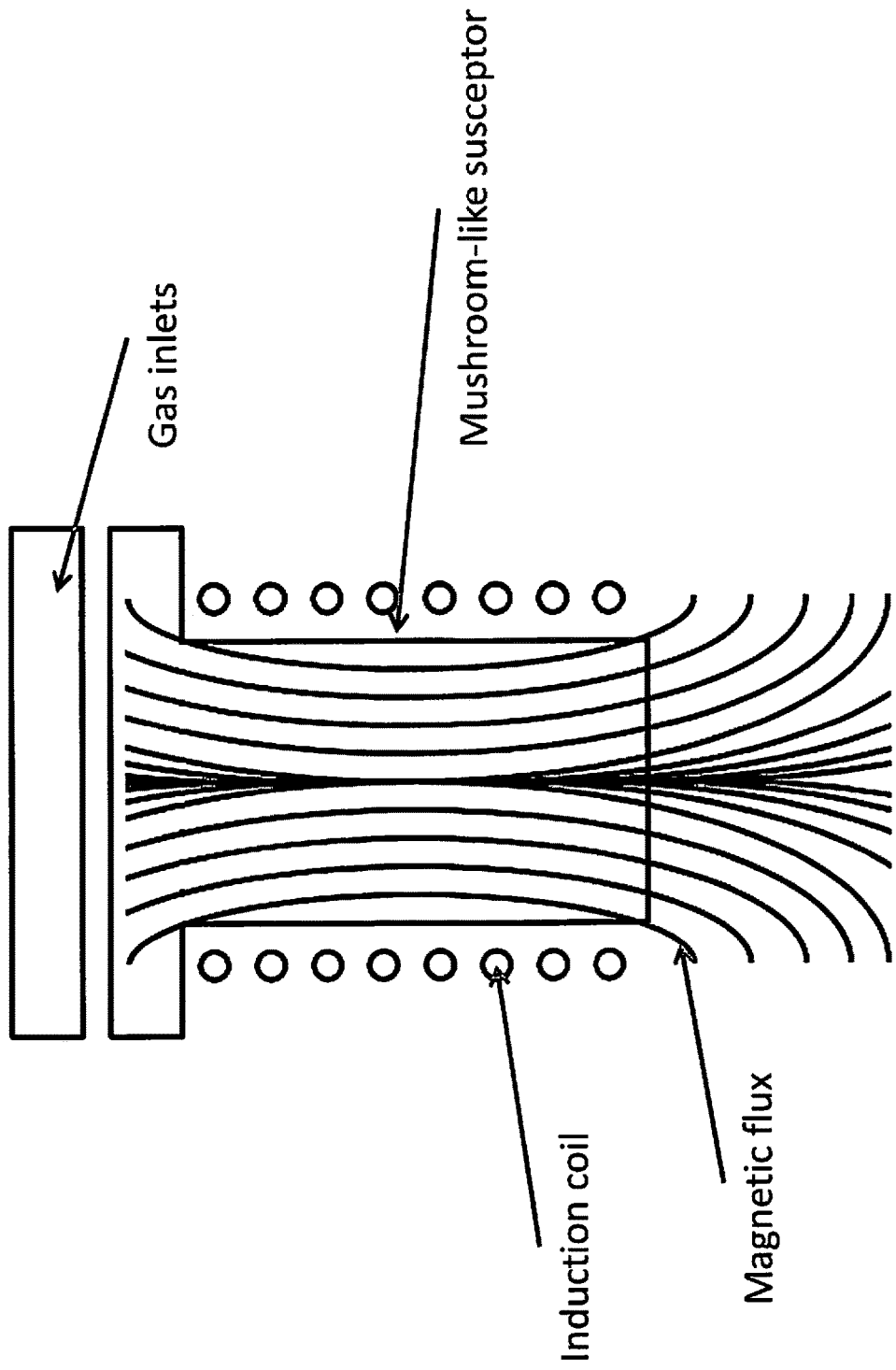
FIG. 6 illustrates in one embodiment how the mushroom-like structure prevents Eddy currents in any conductor above the horizontal plate (such as gas inlets) from the alternating magnetic flux, generated by induction coil, by weakening the strength of the alternating magnetic flux.

For the problem of heating the gas inlets, the horizontal plate of mushroom-like structure can cover the entire upper space of induction coil. The horizontal plate will induce an opposite direction magnetic flux against the one from the induction coil. The result is that the horizontal plate makes a shield for any conductive object above the horizontal plate by weakening the alternating magnetic flux. Also, the induction coils can surround the vertical rod itself but be away from the horizontal plate as shown in FIG. 6.

Induction Heating System

Induction heating systems are known in the art including those used for CVD processing and reactors. See, for example, U.S. Pat. Nos. 6,368,404, 6,217,662, and *Elements of Induction Heating: Design, Control, and Applications*, S. Zinn, S. L. Semiatin, 1988. One or more coils can be used as known in the art, and the spacing of the RF coils can be adapted for the particular application. One skilled in the art can generate a system in which sufficient RF coupling occurs to achieve a desired temperature outcome and have sufficient uniformity of heating. Induction heating allows for higher temperature heating such as more than 1,500° C.

The induction coils can be disposed around the vertical rod and beneath the horizontal plate. In one embodiment, the mushroom susceptor can have multiple vertical rods and each road can be surrounded by a coil, or one coil can surround all the vertical rods at once. FIGS. 12A and 12B show both cases.

In some cases, the prior art has taught use of coils to generate plasma conditions (e.g., see, Gourvest et al., *ECS J. Solid State Sci. Tech.*, 1(6), Q119-Q122 (2012)). However, this is different from use of coils to generate induction heating. In one embodiment, the CVD method is carried out without use of plasma, and the coils are not adapted for use in creating a plasma.

How deep the heat inside the rod (skin depth) depends on the frequency of the AC. The lower the frequency, the deeper the skin depth is. In the inventive design, one needs to heat the whole cross section of the rod to heat the wafer uniformly. This is why low frequencies are advised. However, any frequency can be adopted according to the configuration and the growth condition needed.

Apparatus and Other Components

Figure 2:
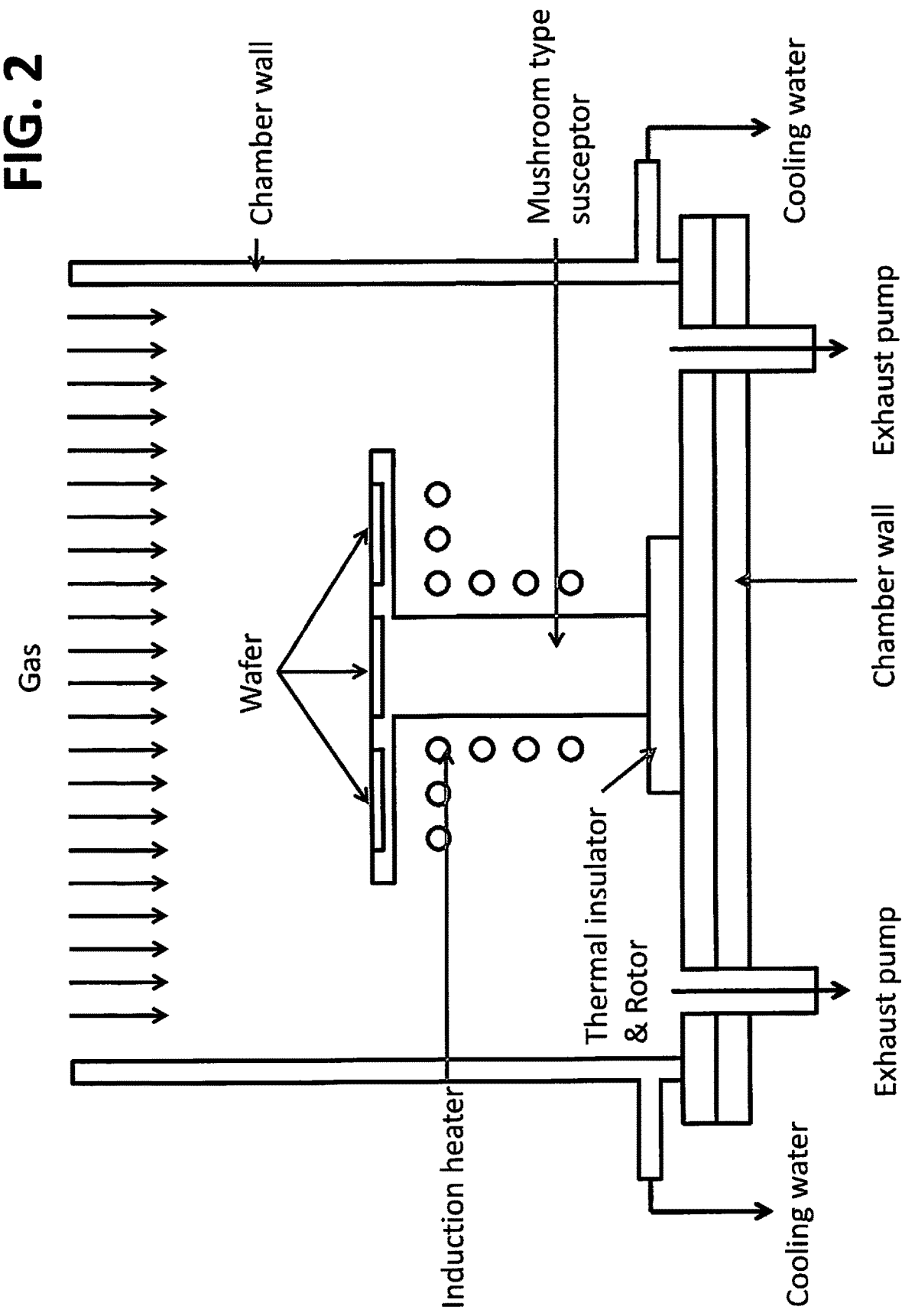
FIG. 2 illustrates one embodiment for a mushroom-like susceptor structure applied in a vertical reactor.
Figure 3:
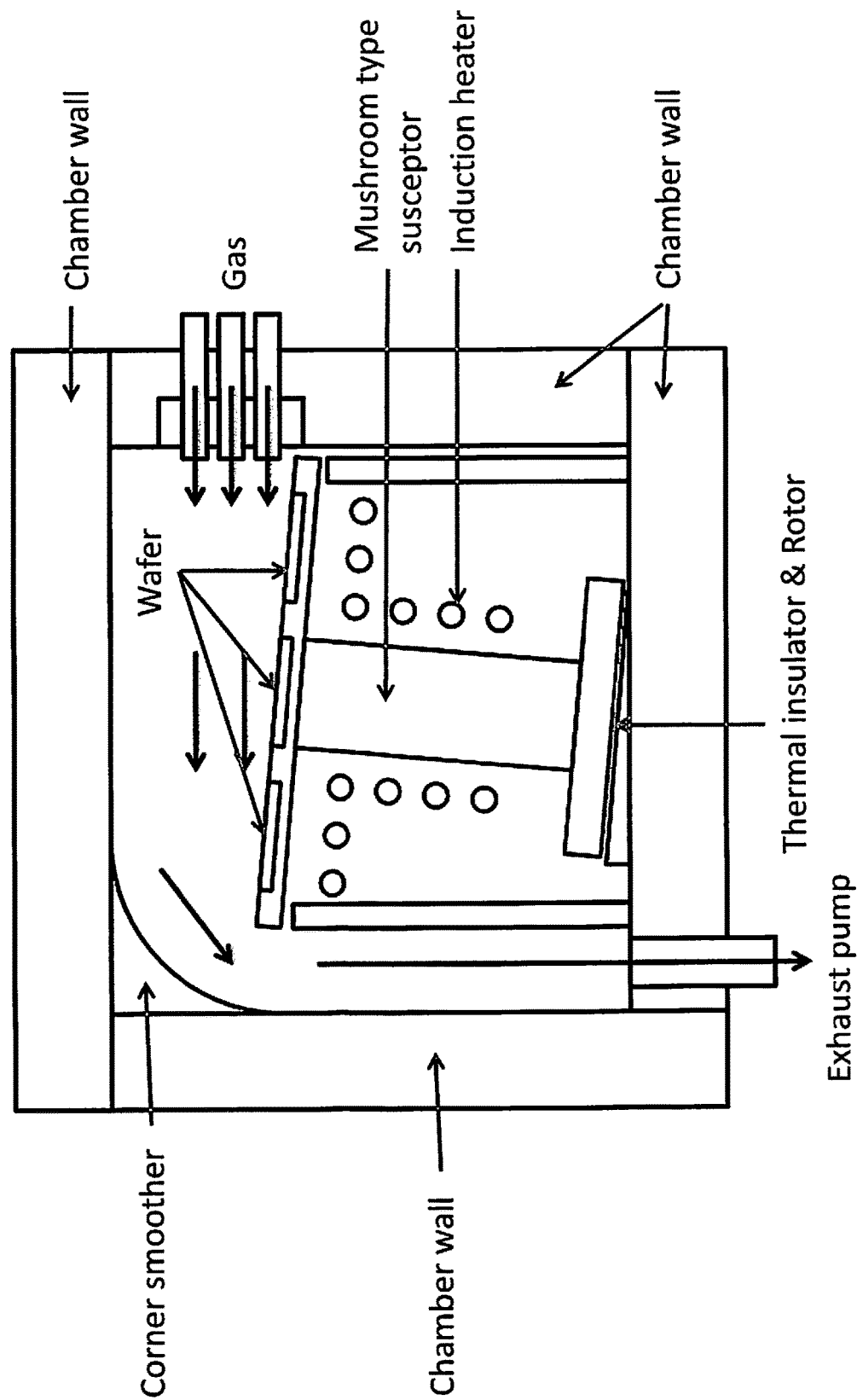
FIG. 3 illustrates one embodiment for a mushroom-like susceptor structure applied in a horizontal reactor in which a wedge can be used for tilting.
Figure 4:
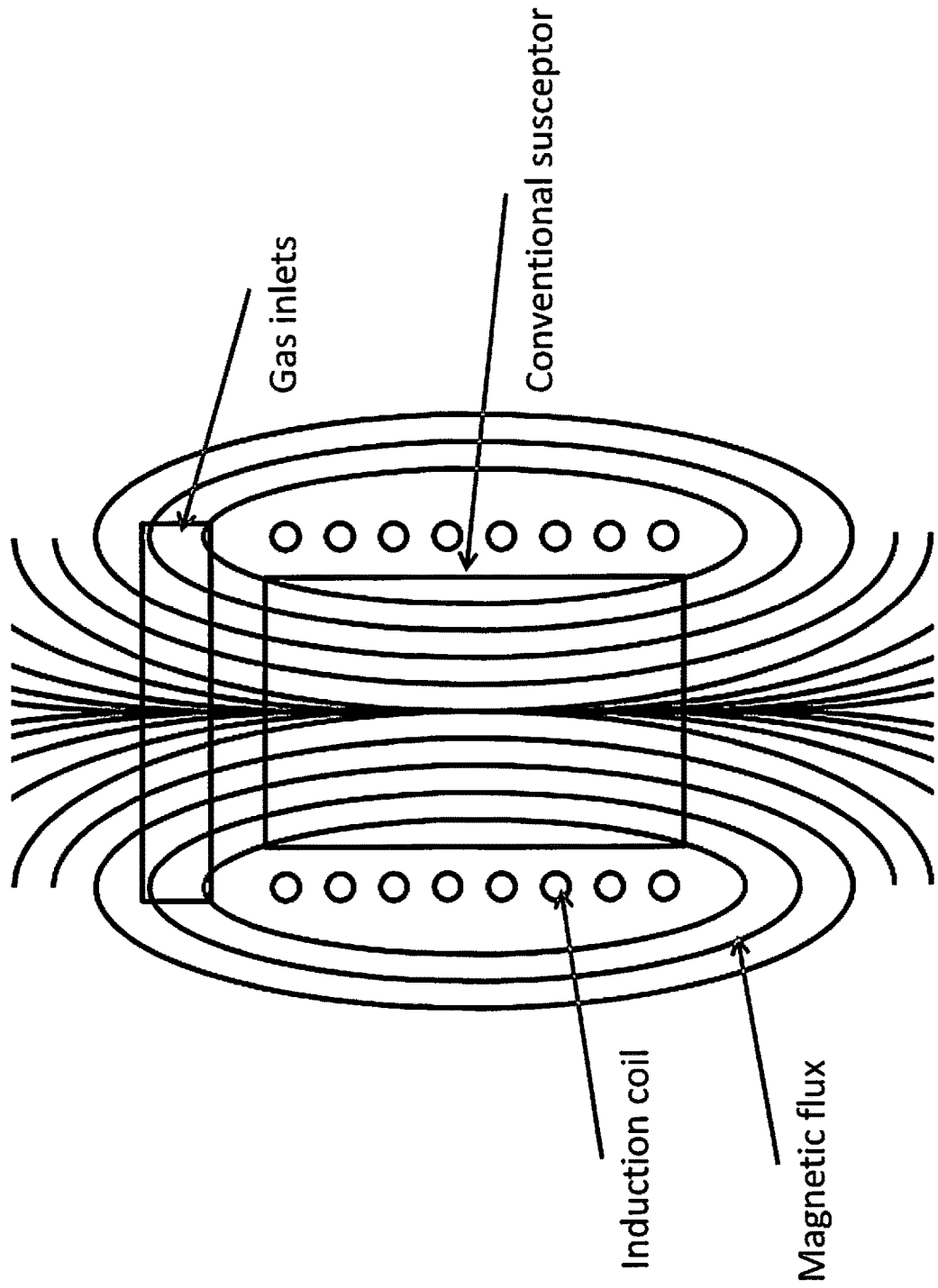
FIG. 4 illustrates in one prior art embodiment how an alternating magnetic flux, generated by induction coil, affects any conductor above the induction coil which can cause magnetic flux leak to the showerhead.

There are many reactor designs for CVD reactors and metal-organic chemical vapor deposition (MOCVD) reactors, such as vertical reactors, as shown in FIG. 2 and FIG. 3, and horizontal reactors as well as known in the art. Reactors can be, for example, cold wall reactors or hot wall reactors. These types of CVD and MOCVD reactors have been used for preparation of a variety of epitaxial compounds, like various combinations of semiconductor single films and heterostructures such as lasers and LEDs.

Elements of a reactor can include, for example, the reaction chamber, reactor walls, a liner, gas injection units, temperature control units, cooling water systems, pressure maintenance systems, gas exhaust systems, and cleaning systems, among other elements.

So-called "showerhead" structures can be used for the gas injectors and introducing into the reaction chamber processing gases, precursors, and/or reactants above the wafers through multiple inlets. Showerhead gas injection structures are known in the art. They can be made of stainless steel, for example. The gap between the wafer and the showerhead structure can be, for example, at least 5 mm, or at least 10 mm, or 5 mm to 20 mm, or about 10 mm. Gas inlets different from showerhead structures can be used if desired.

The reactor can be adapted so that the wafer and susceptor device can be rotated if needed during deposition. They can also be tilted if desired. See, for example, FIGS. 3 and 15.

Methods of Making

The susceptor device and larger reactor can be made by methods known in the art. The material which the susceptor is made of can be machined into the mushroom shape by methods known in the art, and the wafer grooves can be taken into consideration.

APPLICATIONS: METHODS OF USING

As known in the art, a variety of film materials can be epitaxially grown on the wafers such as, for example, aluminum nitride, silicon carbide, gallium nitride, gallium arsenide, indium gallium arsenide, aluminum gallium arsenide, and the like.

The deposition temperature can be, for example, at least 1,500° C. or at least 1,700° C. The upper limit can be, for example, 3,000° C. or the melting point of tungsten.

The quality of the materials can be improved by use of the inventive devices, apparatuses, and methods.

What is claimed is:

1. A susceptor for a chemical vapor deposition reactor comprising:
   at least one horizontal plate configured to hold at least one wafer;
   at least one vertical rod integrated with and perpendicular to the at least one horizontal plate, the at least one vertical rod being configured to support the at least one horizontal plate;
   thermal insulation enclosing the at least one vertical rod;
   an induction coil fully enclosing only the at least one vertical rod, wherein the thermal insulation is located between the at least one vertical rod and the induction coil; and
   at least a screw configured to screw the thermal insulation to a base of the reactor or a rotor,
   wherein the induction coil is configured to generate induction heating in the at least one vertical rod, and thermal conduction between the at least one vertical rod and the at least one horizontal plate heats the at least one horizontal plate.

2. The susceptor of claim 1, wherein the susceptor is free of a resistive heater.

3. The susceptor of claim 1, wherein the susceptor comprises two or more vertical rods integrated with and perpendicular to the at least one horizontal plate.

4. The susceptor of claim 1, wherein the vertical rod functions as a heat source for the at least one horizontal plate.

5. The susceptor of claim 1, wherein the thermal insulation fully encircle the at least one vertical rod.

6. The susceptor of claim 1, wherein the at least one vertical rod attaches with threads to the thermal insulation.

7. The susceptor of claim 1, wherein a portion of the susceptor where the at least one vertical rod is integrated with the at least one horizontal plate has curved corners.

8. A chemical vapor deposition apparatus, comprising:
   a reaction chamber;
   a base located inside the reaction chamber and configured to rotate;
   a susceptor arranged in the reaction chamber on the base, wherein the susceptor comprises
      a horizontal plate configured to hold at least one wafer;
      a vertical rod integrated with and perpendicular to the horizontal plate, wherein the vertical rod is attached to the base and is configured to support the horizontal plate;
   thermal insulation enclosing the vertical rod; and
   an induction coil arranged fully around the vertical rod and the thermal insulation, below the horizontal plate, the horizontal plate blocking an alternating magnetic flux induced by the induction coil.

9. The chemical vapor deposition apparatus of claim 8, wherein the thermal insulation is arranged between the vertical rod and the induction coil, and the thermal insulation is screwed to the base.

10. The chemical vapor deposition apparatus of claim 9, wherein the vertical rod has threads and an inner wall of the thermal insulation includes corresponding threads.

11. The chemical vapor deposition apparatus of claim 9, further comprising:
   a screw that penetrates the base of the reaction chamber, a base of the thermal insulation, and the susceptor.

12. The chemical vapor deposition apparatus of claim 9, wherein the thermal insulation has a body surrounding the vertical rod and first and second legs that are perpendicular to the body, wherein the first leg is arranged adjacent to the horizontal plate and the second leg is arranged adjacent to a base of the reaction chamber.

13. The chemical vapor deposition apparatus of claim 12, further comprising:

a screw passing through the second leg of the thermal insulation and into the base of the reaction chamber.

14. The chemical vapor deposition apparatus of claim 8, further comprising:
   gas inlets.

15. The chemical vapor deposition apparatus of claim 14, the horizontal plate includes one or more regions configured for accepting one or more wafers and the gas inlets are arranged less than 10 mm from a surface of the one or more wafers.

16. The chemical vapor deposition apparatus of claim 8, wherein a diameter of the at least one vertical rod is greater than a diameter of the at least one horizontal plate.

17. The chemical vapor deposition apparatus of claim 8, wherein a portion of the susceptor where the at least one vertical rod is integrated with the at least one horizontal plate has curved corners.

* * * * *